United States Patent [19]
Zimnicki et al.

[11] Patent Number: 5,406,682
[45] Date of Patent: Apr. 18, 1995

[54] METHOD OF COMPLIANTLY MOUNTING A PIEZOELECTRIC DEVICE

[75] Inventors: Charles Zimnicki; Iyad Alhayek, both of Schaumburg, Ill.

[73] Assignee: Motorola, Inc., Schaumburg, Ill.

[21] Appl. No.: 172,662

[22] Filed: Dec. 23, 1993

[51] Int. Cl.6 .................. H01L 41/22; H01L 41/08
[52] U.S. Cl. .................... 29/25.35; 310/364
[58] Field of Search ............... 29/25.35, 841, DIG. 1; 310/312, 344, 363-366

[56] References Cited

U.S. PATENT DOCUMENTS

| | | | |
|---|---|---|---|
| 2,266,333 | 12/1941 | Ream | 29/25.35 X |
| 2,266,768 | 12/1941 | Kornei | 29/25.35 X |
| 2,510,811 | 6/1950 | Gale | 29/25.35 X |
| 3,128,532 | 4/1964 | Massa | 29/25.35 |
| 4,217,684 | 8/1980 | Brisken et al. | 29/25.35 |
| 4,293,986 | 10/1981 | Kobayashi et al. | 310/344 X |
| 4,472,652 | 9/1984 | Brice et al. | 310/364 X |
| 4,757,581 | 7/1988 | Yamada et al. | 310/365 X |

FOREIGN PATENT DOCUMENTS

| | | | |
|---|---|---|---|
| 57-93715 | 6/1982 | Japan | 29/25.35 |
| 8159012 | 9/1983 | Japan | 29/25.35 |

Primary Examiner—Peter Dungba Vo
Attorney, Agent, or Firm—Gary J. Cunningham

[57] ABSTRACT

A method of compliantly mounting piezoelectric device with a substrate. First, outer portions of a piezoelectric element are selectively metallized. Next, one layer of aluminum is selectively dispensed on the piezoelectric element. Third, an uncured conductive compliant material is placed and aligned on a substrate. Fourth, the piezoelectric element is placed and aligned on the conductive compliant material, such that upon curing the conductive compliant material forms a compliant mount connecting the outer metallized portions of the piezoelectric element with the substrate.

14 Claims, 2 Drawing Sheets

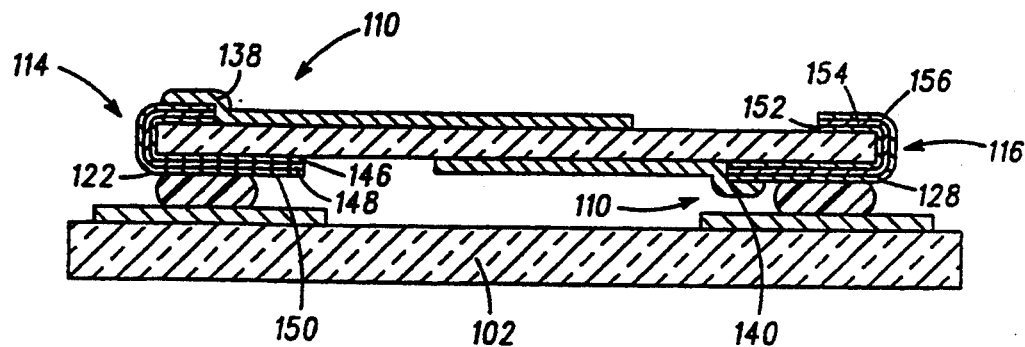
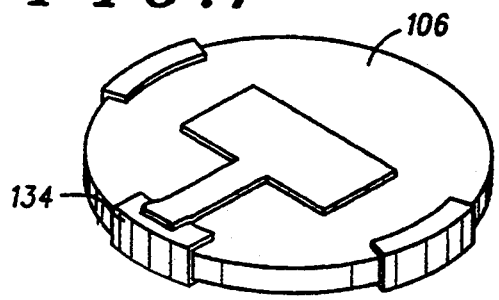
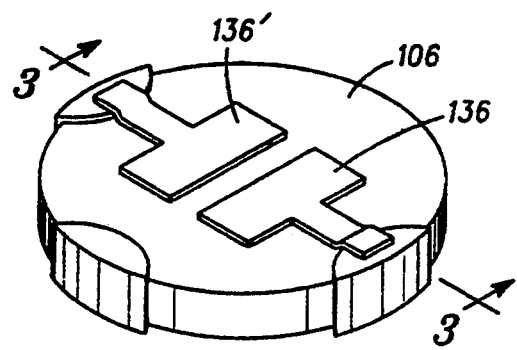
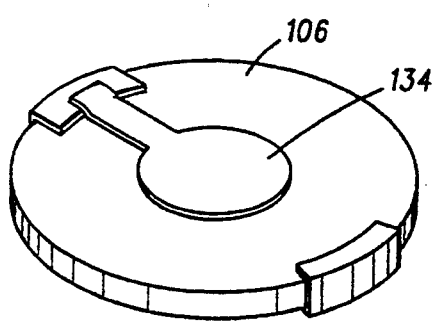
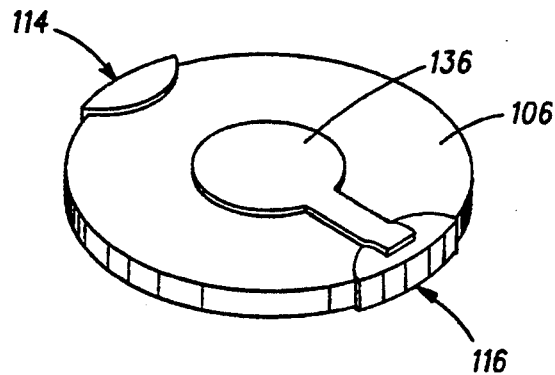

METHOD OF COMPLIANTLY MOUNTING A PIEZOELECTRIC DEVICE

FIELD OF THE INVENTION

The present invention relates generally to frequency control devices and, in particular, to a method of mounting a piezoelectric device with a substrate.

BACKGROUND OF THE INVENTION

Piezoelectric devices, such as piezoelectric quartz filters, piezoelectric quartz resonators and the like; typically include a piece of piezoelectric material mounted to a substrate. In quartz devices, the quartz element of necessity has thin metallic electrodes attached to it through which electrical signals are coupled into and out of the piezoelectric quartz material. Common problems with piezoelectric devices are adequately isolating the piezoelectric device from mechanical shock and dealing with thermal expansion coefficient mismatches between the piezoelectric material and the substrate material.

Quite often, the piezoelectric devices, such as a piezoelectric quartz material and the substrate have mismatched thermal expansion coefficients. This mismatch can cause mechanical stresses to be induced in the quartz as time goes by during the life of such devices, as the quartz and substrate expand and contract over temperature variations. Further, mechanical shock transferred to the quartz through its mounting structure can increase mechanical stresses that in addition to the thermal stress, adversely affect the output frequency and accuracy of these devices.

Various attempts over the years have been developed in an attempt to compliantly mount piezoelectric quartz devices to a substrate. For purposes of this application, a compliant mount for a piezoelectric device, is a mounting device, apparatus or other mounting means that attempts to reduce or minimize mechanical stresses on the piezoelectric quartz element. Some prior art compliant mounting devices have used thin foil tabs that act as spring-type mounting structures that attempt to isolate the quartz element from its substrate. Other types of compliant mounting structures have attempted to use substrate materials having thermal expansion coefficients which more closely match the thermal expansion coefficient of the quartz material itself.

Most, if not all of the prior art compliant mounting schemes are difficult to use because of the small physical dimensions that modern piezoelectric quartz elements have. Using bent foil tabs alone, for example, to compliantly mount a small silver of quartz onto a substrate is not a structure that lends itself to economic mass production of quartz crystal devices.

A prior art overtone crystal mount structure is shown in FIG. 1. The crystal mount structure 10 includes a substrate 12, conductive pads 14 attached to an external portion of the substrate for electrical connection to the structure 10, a pair of C-shaped mounts 16, a piezoelectric element 18 including a left wraparound electrode 20 and a right wraparound electrode 22 coupled to the C-shaped mounts by an upper adhesive 24. A lower adhesive 26 securely couples the C-shaped mounts 16 to the conductive pads 14. The adhesives 24 and 26 are epoxy.

When an AC voltage is applied across the pads 14, the piezoelectric element 18 vibrates acoustically at a certain displacement. The resonant frequency of the piezoelectric element 18 drifts about a nominal frequency, in part due to changes of temperature, stresses, exposure to mechanical shock, microcracks in the quartz and the like.

There is a need for an improved method of mounting a piezoelectric device with a substrate, to: (i) minimize the mechanical stresses induced due to the thermal expansion mismatches between the two; (ii) provide a mechanically sufficient coupling such that the device can withstand mechanical shocks; and (iii) provide a method of crystal attachment which is adaptable to mass production.

Accordingly, a low cost, readily-manufacturable, compliant mount for a piezoelectric device would be an improvement over the prior art. A method by which quartz devices can be easily and readily attached to a substrate and which isolates the quartz element from mechanical stresses would be an improvement over the art.

BRIEF DESCRIPTION OF THE DRAWINGS

FIG. 4 shows a cross-sectional view of a preferred embodiment of a compliantly mounted overtone piezoelectric device.

FIGS. 5 and 6 show upper and lower perspective views of the compliantly mounted piezoelectric device in the form of a crystal oscillator, shown in FIGS. 3 and 4, in accordance with the present invention.

FIGS. 7 and 8-show upper and lower perspective views of the compliantly mounted piezoelectric device in the form of a filter, shown in FIGS. 3 and 4, in accordance with the present invention.

DETAILED DESCRIPTION OF THE PREFERRED EMBODIMENT

Figure 2:
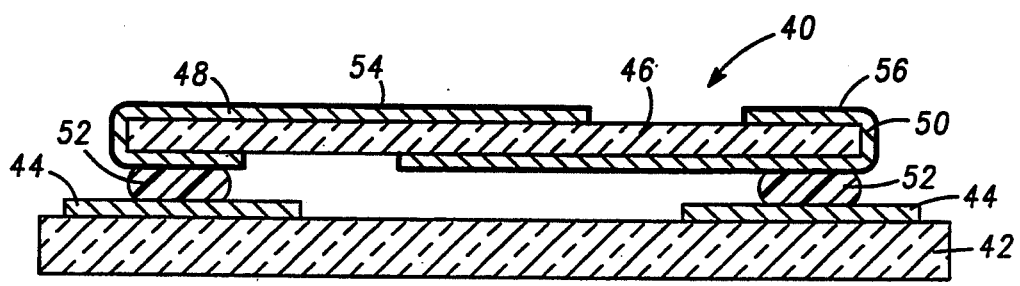
FIG. 2 shows a cross-sectional view of an overtone crystal mount structure attempted by applicant, to mount an overtone crystal to a substrate.

FIG. 2 shows a cross-sectional view of an attempt to directly mount an overtone crystal to a substrate. More particularly, the attempted overtone crystal mount structure 40, includes a substrate 42 with conductive pads 44, a piezoelectric element 46, top and bottom wraparound electrodes 48 and 50 and a compliant conductive adhesive 52 electrically connecting and mechanically mounting the piezoelectric element 46 to the substrate 42. The top and bottom electrodes 48 and 50 comprise aluminum. The aluminum oxidizes immediately upon exposure to air, making it difficult to electrically connect the electrodes 48 and 50 to the conductive adhesive 52. More specifically, layers of aluminum oxide 54 and 56 form on the exposed electrode surfaces. Because aluminum oxide is a dielectric material of high mechanical strength, effective electrical connection between the compliant conductive adhesive 52 and the electrodes 48 and 50 is not made.

Figure 1:
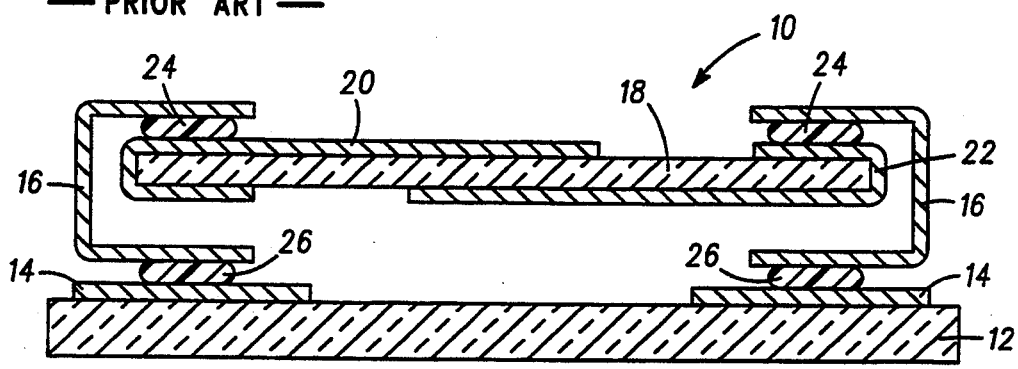
FIG. 1 is an enlarged cross-sectional view of a prior art crystal mount structure.

The conductive epoxy 24 and 26 used in the crystal structure of FIG. 1. is a high strength, rigid material that significantly decreases it's volume when it cures. This induces stresses in the bonded surfaces. If such epoxy is used to bond oxidized aluminum, the epoxy exerts forces during cure which break the oxide layer so the electrical connection can be made effectively between electrodes 20 and 22 and the conductive epoxy 24.

The compliant adhesive 52 used in the structure in FIG. 2. remains soft during the entire cure cycle, and does not significantly change its volume. Therefore, the unwanted aluminum oxide layers 54 and 56 are not broken during cure. Although an acceptable electrical connection in FIG. 1 is made, there are many disadvantages to the structure in FIG. 1. The number of parts used in the device is much greater because of the metal foils that are necessary to relieve thermal mismatch between piezoelectric element 18 and the substrate 12. In addition, the number of process steps to make the device 10 can be greater or more time consuming, for example, the epoxy must be dispensed and cured twice. More particularly, first epoxy 24 is applied to attach the piezoelectric element 18 to the foils 16, and second, epoxy 26 is applied to connect and attach foils 16 to the substrate 12. Two cure cycles may be necessary.

Figure 3:
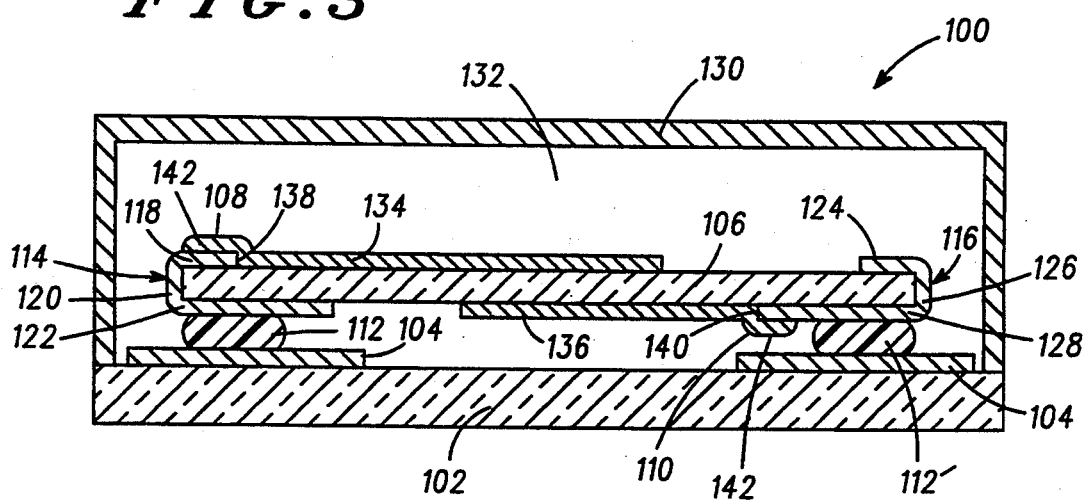
FIG. 3 shows a cross-sectional view of one embodiment of an improved, compliantly mounted piezoelectric device.

FIG. 3 is a cross-sectional view of a compliantly mounted piezoelectric device that incorporates an improved mounting method. The device 100 includes a substrate 102 typically made of the ceramic material, conductive pads 104 being coupled to or connected with the outer portion of the substrate 102 for providing electrical connection to the device 10. The piezoelectric device 106 has upper and lower electrodes 134 and 136 preferably aluminum, that connect to left and right metallized outer portions 114 and 116 by means of wraparound structures. More specifically, the left metallized outer portion 114 includes upper, middle and lower sections 118, 120 and 122. Similarly, the right metallized outer portion 116 includes upper, middle and lower sections 124, 126 and 128 respectively. Bottom sections 122 and 128 of metallizations 114 and 116 are electrically and mechanically connected to the conductive pads 104 by means of a conductive compliant interface 112 and 112'.

A cover 130, typically made of metal and ceramic, substantially surrounds and encloses the piezoelectric device 106 to provide an inner, inert environment 132.

In FIG. 3, on an upper and lower portion or surface of the piezoelectric device 106 are upper and lower electrode patterns 134 and 136, respectively. The upper and lower electrode patterns 134 and 136 electrically connect to the left and right metallized outer portions 114 and 116 to form upper and lower contact areas 138 and 140, respectively. The contact areas 138 and 140 are sufficiently large to provide electrical connections between the upper and lower electrode patterns 134 and 136 with the left and right metallized outer portions 114 and 116 respectively. It is desirable that these contact areas provide a very low resistance.

In proximity to where the upper and lower electrode patterns 134 and 136 meet with the left and right metallized outer portions 114 and 116, respectively, are upper and lower overlay portions 142 and 144, which provide large areas of electrical connections.

Referring to FIG. 4, in one embodiment, the left and right metallized outer portions 114 and 116, each include first layers 146 and 152, second layers 148 and 154 and third layers 150 and 156, respectively.

FIGS. 5 and 6 show upper and lower perspective views of the piezoelectric device 106 showing the upper and lower electrode patterns 134 and 136 and left and right metallized outer portions 114 add 116.

And, in FIGS. 7 and 8 upper and lower perspective views of the piezoelectric device 106 with the upper and lower electrode patterns 134, 136 and 136' are shown. The device shown in FIGS. 7 and 8 is in the form of a crystal filter, which includes all of the structure in the preceding figures and includes three electrical connections.

There are two major applications of piezoelectric elements, crystal filters FIGS. 7 and 8 and crystal resonators FIGS. 5 and 6. Crystal filters; are used whenever incoming electrical signals must be filtered in order to suppress signals that fall in an unwanted range of frequencies, that is outside the passband of this filter. The signals that are within the frequency range of the passband of such filter are passed through the filter without significant signal loss. Crystal resonators are used as frequency control devices in oscillating circuits.

The instant method, in its simplest form, involves compliantly mounting a piezoelectric device, in the following steps. The first step involves selectively metallizing outer portions 114 and 116 of a piezoelectric element 106. Next, a predetermined layer pattern of aluminum is selectively deposited on the piezoelectric element 106, to form a certain desired electrode pattern 134 and 136 in contact with the outer metallized portions 114 and 116. Thereafter, an uncured conductive compliant material 112 and 112' is selectively dispensed on a substrate 102. And next, the piezoelectric element 106 is placed and aligned on the compliant conductive material such that upon curing the conductive compliant material forms a compliant mount (or interface).

This method of attachment is particularly useful when used with a device having aluminum electrodes. If a device with aluminum electrodes is attached to a substrate using the method and structure in FIG. 2, aluminum oxide forms on layers 54 and 56, thus inhibiting the making of a good electrical connection. If a device is constructed in accordance with the methods show in FIGS. 3 and 4, with outer metallization layers 114 and 116, the oxide layer formed on aluminum electrodes will not interfere with an electrical path, which, in these devices, is through metallized portions 114 and 116. The metals used in the process of making layers of metallized portions 114 and 116 are chosen such that they will not easily oxidize when exposed to air.

The selective metallizing step can include providing a plurality of layers of metals on the outer portions 114 and 116 of the piezoelectric element 106, for improved adhesion to the piezoelectric element 106. More particularly, the selective metallizing step can include providing: a first layer 146 and 152 comprising chromium directly on an outer portion of the piezoelectric element 106; a second layer 148 and 154 comprising a precious metal on the first layer 146 and 152 respectively; and a third layer comprising chromium on the precious metal of the second layer, for improved adhesion of the metallized portions 114 and 116 to the compliant interface 112 and 112', and also for improved adhesion to the aluminum electrodes in the areas of overlap or contact. In a preferred embodiment, all layers of metallized portions 114 and 116 are selectively applied in a vacuum environment. The piezoelectric devices remain in vacuum as different metals are applied to produce layers of metallization on the piezoelectric device that include the metallized portions in FIG. 4.

In a preferred embodiment, the uncured conductive compliant material is cured sufficiently to form a conductive compliant interface or mounting structure.

More particularly, the conductive compliant material is cured for a predetermined time at a predetermined temperature to form in a manner which gives a desired compliance.

The conductive compliant interface 112 and 112' can comprise a wide range of materials so long as it forms upon curing a compliant support structure.

In a preferred embodiment, the interface 112 and 112' includes a silicone-based adhesive-like material. Such materials are relatively newly developed materials that cure in air over a wide temperature range, and after suitable curing are compliant yet have a certain threshold resilience. In one embodiment, the silicone-based adhesive comprises a metallic powder, preferably a silver powder to provide the required conductivity.

The silver powder content in the silicone can range widely. In a preferred embodiment, the silver content ranges from about 70% to about 85% by weight, the lower range being sufficient to have the desired conductivity and the upper range being limited so as to minimize any adverse affects on the adhesive properties, and most preferably about 75% to about 80%, for minimizing resistance (power drain), while being processable and reproducable.

In a preferred embodiment, the interface 112 and 112' comprises the silver-filled silicone which is suitably cured to form a compliant gel of material that couples the piezoelectric element 106 with respect to the substrate 102. This material provides an additional cushioning and isolation from shock, and includes sufficient elasticity to allow expansion and contraction of the piezoelectric element 106 with respect to the substrate 102 with minimal stress.

The curing step is important in forming an interface 112 and 112' having a sufficient compliance, to desirably: (i) couple the piezoelectric element 106; (ii) allow the piezoelectric element 106 to move somewhat due to its thermal expansion coefficient; (iii) minimize shock transfer; (iv) minimize outgassing; (v) minimize electrical resistance; and (vi) minimize frequency shifts over a wide temperature range.

In a preferred embodiment, the curing step includes curing the material 112 and 112' for at a predetermined time and temperature to form an interface having the above desirable characteristics. More particularly, when the interface 112 and 112' comprises a silver-filled silicone the uncured material is cured in an oven at about 80° C. to about 180° C., and preferably about 120° C. to about 160° C. for improved results, for a duration of about 30 minutes to about 4 hours, preferably about 150° C. for about 90 minutes for minimizing outgassing of the material and improved integrity. More particularly, in a preferred embodiment, the silicone-based adhesive material, provides a soft and compliant support and coupling, which allows the piezoelectric element 106 to float with respect to the substrate 102.

In a preferred embodiment, the curing step can further include a post cure high temperature conditioning step. It is believed that a high temperature conditioning step can further minimize outgassing of the interface 112 and 112' and improve cross-linking of the material comprising the interface 112 and 112' and adhesion to the bond sites.

The protocol regarding the conditioning step can vary widely. In one embodiment, the conditioning step varies from about 90 minutes to about 5 minutes, and preferably ranges from about 40 minutes to about 20 minutes, for minimizing processing time and outgassing, and improving cross-linking and compliance. The temperature for this conditioning step can range widely. In one embodiment, the temperature can range from about 400° C. to about 200° C., and preferably ranges from about 300° C. to about 350° C., which is sufficiently high to provide cross-linking of the material to itself and the bond sites, and sufficiently low so as not to shock or degrade the material.

When the silver-filled silicone is utilized, it is believed that high temperature conditioning for about 30 minutes at between 325° C. to 350° C. will provide the best results in terms of minimizing outgassing, lowering frequency shifts in the temperatures of interest (or improving output accuracy), and providing a compliant coupling.

In one embodiment, the interface 112 and 112' has a compliance, as measured by Young's Modulus which can vary widely. In one embodiment, the Young's Modulus is about $10 \times 10^5$ N/m$^2$ or less, so that it does not have an excessive amount of rigidity and is not excessively low so that an interface with sufficient integrity for withstanding mechanical shock is formed.

Examples of some preferred adhesives useful as interface 112 and 112' include Emerson and Cuming, Inc.'s (a Division of W. R. Grace), so-called electrically conductive silicone dye attach materials, Product Nos. LE3355-35, LE-4017-71 and LX-3739-98. These materials are believed to be essentially single component silver-filled silicone adhesives and are thermally and electrically conductive. It is believed that the thermal conductivity helps to dissipate the heat and dampen the thermal differences between the piezoelectric element 106 and substrate 102.

In a preferred embodiment, the material 112 and 112' comprises the Emerson and Cuming, Inc.'s Product Numbers LE-4017-71 and LX-3937-98 depending on the application. The rheology of these materials provide a consistency adapted for simplified application which can support a piezoelectric element before curing, and which will not spread uncontrollably to unwanted places. However, other materials may be utilized in connection with this invention so long as they have the desired properties and characteristics, as detailed herein. The preferred materials are used to form a physically compliant, and electrically and thermally conductive connection.

After curing, the piezoelectric element 106 can be frequency tuned by adjusting the mass of the electrode pattern 134 or 136, typically the upper electrode pattern 134 because it is more accessible. In a preferred embodiment, the frequency tuning is done in a vacuum environment where metal is deposited in predetermined area on the upper electrode pattern 134.

After tuning, typically the piezoelectric device 100 includes a step of enclosing the piezoelectric element 106 in an inert environment, by attaching a cover 132 to the substrate 102. Typically, the device 100 is placed in a vacuum environment to evacuate all gasses, that may be detrimental to the device. Then, without exposure to air, the device is placed in an inert gas atmosphere such as nitrogen, where it is hermetically sealed.

In a preferred embodiment, an overtone device is made with the instant invention. The following excerpts provide a brief explanation of many important matters provided for and considered in this invention.

It is the design goal of a resonator designer to build a piezoelectric resonator which exhibits an isolated resonance at the desired frequency. This resonance is responsible for the electrical characteristics of the crystal or filter being designed. A resonator will have other mechanical resonances which must be suppressed through appropriate design of the physical construction of the unit. These unwanted resonant responses are called spurious responses.

The physical laws governing the design of a resonator determine if these spurious responses will exist in the finished unit. Existing design theory recognizes the number and intensity of the spurious responses are a function of the electrode dimensions (area) and the difference in frequency between the metallized electrode and the un-metallized blank. This difference in frequency is caused by the addition of mass which makes up the electrode. This limitation is described by "wavetrapping" theory which provides a relation between the existence of spurious modes and the dimensions and mass of the electrode.

It is usually desirable to make the electrodes of a filter crystal as large as practical. This is done to lower the electrical impedance of the filter which is desirable because it makes the surrounding electrical circuit easier to design and because it allows looser dimensional tolerances to be used in designing the electrode array. The maximum size of the electrode is limited by wavetrapping because as the electrode becomes larger the allowable mass which can be deposited on the electrode area becomes smaller. The mass is reduced by making the metallization thickness thinner to achieve the desired mass.

The limiting factor on how thin an electrode can be made is the electrical conductivity of the film which makes up the electrode. As the film becomes thinner its resistance increases. Below a certain thickness determined by the metallization used, the electrode(s) become non-conductive and therefore unusable. There is a minimum thickness which can be used for any given material such as gold, silver and aluminum.

For these reasons, aluminum is the metal of choice used on high frequency filters and in particular overtone filters. Aluminum is the lowest density plating material available and is sufficiently conductive at low film thicknesses. Aluminum allows electrodes of greater area to be used which satisfy the wavetrapping conditions necessary to suppress unwanted spurious resonances.

It is also advantageous to use flexible adhesives such as a silicon based adhesive used in this invention, because the mounting required for the crystal can be made mechanically simpler, more shock resistant and less subject to stresses caused by thermal changes. Unfortunately, aluminum forms an oxide when exposed to the atmosphere which prevents the silicon adhesive from making a low resistance bond to the aluminum electrode material.

This invention minimizes this problem by forming bonding interface areas which avoid the direct aluminum to silicon adhesive bond. In this method, the aluminum electrode forms a bond and electrical connection to a different metal (chrome and gold bonding pad). The silicon adhesive is then placed on the metal, for example a gold surface of the bonding pad to form the mechanical and electrical connection to the package contacts. This avoids or minimizes the problem because gold is inert and does not oxidize or chemically react with the silicon adhesive.

The gold also forms a good bond with the aluminum plated electrode because the aluminum and gold material alloy to form intermetallics. In a preferred embodiment, the chrome sublayer is used to form a good mechanical bond between the gold layer and the quartz substrate. The chromium forms oxides which bond to the silicon dioxide structure of the quartz. The chrome is allowed to diffuse into the gold layer to form a good electrical and mechanical bond between the chrome layer and the gold layer.

Thus, this method allows the use of an optimal electrode material, which is aluminum, with a flexible mounting system, which is a silicon adhesive, to achieve good characteristics and properties.

In a preferred embodiment, the method involves compliantly mounting an overtone piezoelectric device with a substrate, which comprises the following steps. First, outer portions 114 and 116 of a piezoelectric element 106 are selectively metallized. This is to provide sufficient metallic areas of contact with the compliant interface 112 and 112'. The materials making up outer portions 114 and 116 are selected to minimize the possibility of oxidizing, since appropriate metals are chosen which resist oxidation. Next, a layer of aluminum is selectively deposited on the piezoelectric element, by forming a predetermined electrode pattern and forming an overlap portion connected to the metallized outer portions 114 and 116. The overlap 142 and 144 and contacts 138 and 140 are important it provide a good electrical connection between the electrodes 134 and 136 and the metallized outer portions 114 and 116. The next step involves dispensing a conductive compliant material 112 and 112' on the substrate 102. The compliant interface 112 and 112' is a means of providing an electrically conductive and mechanically compliant mount system, that is used for the attachment of the piezoelectric element 106 to the substrate 102. The next step involves placing the piezoelectric element 106 on the conductive compliant adhesive 112 and 112'. This is to physically attach the piezoelectric element 106 to the substrate 102. In this step the adhesive 112 and 112' makes contact mainly with the outer metallized portions 114 and 116 so good electrical connections can be made. The next step involves curing the conductive compliant adhesive such that a compliant coupling is formed coupling the outer metallized portions of the piezoelectric element with the substrate. In this step the adhesive changes state from a thick liquid to a firm, rubber-like compliant material (interface) that securely holds the piezoelectric element 106 to the substrate 102.

It should be noted, that the selectively metallized outer portions 114 and 116 are configured to include a sufficiently large surface area to facilitate and simplify placement and alignment with the conductive compliant adhesive 112 and 112'. They are also configured, to provide a planer and sufficiently large area to provide a good electrical and mechanical connection.

In one embodiment, a plurality of layers of metals on the outer portions 114 and 116 of the piezoelectric element 106 are included.

In a preferred embodiment, the first layer 146 and 152 is a metal, typically chromium, for improved adhesion of the second layer metal 148 and 154, typically gold or silver, to the piezoelectric element 106. The outer layer of metal 150 and 156, typically chromium, is used to increase adhesion of the aluminum electrodes 134 and 136 (and 136' in FIG. 8) and compliant material 112 and 112' to the metal used as the second layer 148 and 154. All three layers of metal are applied in a vacuum environment in the same vacuum cycle. Moreover, very thin layers of metal are applied as first and third layers, typically about 50 to 100 angstrom. Therefore, deposition of the two additional layers of metal does not significantly increase the process time.

Aluminum is used as the electrode material, especially in high-frequency applications, since the aluminum adheres tenaciously to the piezoelectric element 106, or quartz, because of the nature of the silicon to oxygen to aluminum bonding. The acoustic impedance of aluminum closely matches that of quartz materials, thereby minimizing the affects of acoustic reflection at the quartz-aluminum interface, resulting in minimal losses. Aluminum is also a preferred material for electrodes in many quartz devices because of it's low mass. In many instances, the quartz device will exhibit excessive unwanted resonances and spurs, if high mass electrodes are used in the design. In these cases, it is beneficial to reduce the mass of the electrodes. One way to decrease the electrode mass is to reduce the thickness of the applied metal. However, very thin electrodes can exhibit lower electrical conductance which impairs the performance of the device. Therefore, it is beneficial to use an electrode with a material that will have lowest mass and good electrical conductance. Aluminum is such a material, having a high ratio of electrical conductance to mass.

The aluminum also gives good electrical conductance given the low thickness. Accordingly, it provides a good electrical contact, yet minimizes mass loading because of its lightweight characteristic. Second, aluminum closely matches the acoustic impedance of quartz materials, thus resulting in minimal signal losses. And aluminum provides good adhesion to the piezoelectric element.

The metallized outer portions 114 and 116 are sufficiently thick to provide good conductivity. In one embodiment, the metallized outer portions 114 and 116 are about 700 Å or more, and preferably about 1500 Å to provide a minimal metal thickness that still provides good electrical conductance of the metal. It is believed that metal thicknesses in excess of 2000 Å will increase loss of material in the process, and increase the metallization process time, making the device more costly.

In a preferred embodiment in FIG. 4, the first and third layers of chromium are generally sufficiently thick to provide good adhesion of the metals used in outer portions 114 and 116 to the quartz 106, and to the aluminum electrodes 134 and 136, respectively. In a preferred embodiment, the chromium layers each include a thickness of about 400 Å or less, and preferably 50 Å to 100 Å for good adherence. In this embodiment, the second layer 148 and 154 comprise a precious metal, preferably a layer of gold or silver, which is sufficiently thick to provide good electrical conductance. The precious metal generally ranges in thickness from about 1000 Å to about 2000 Å, and preferably about 1500 Å. Thicknesses lower than 1000 Å may result in potential poor conductance and thickness higher then 2000 Å can result in unnecessary process time and material loss. The preferred metal is gold or silver because these precious metals do not significantly oxidize when exposed to air, and most preferably gold because of its improved resistance to oxidation.

In a preferred embodiment, the device 100 is hermetically sealed to minimize continued and unwanted aluminum reactions, in connection with oxygen to form $Al_2O_3$ or sapphire, for example. Thus, the hermetic seal minimizes the possibility that the aluminum-plated units will exhibit poor aging characteristics with the frequency decreasing with time.

In one application, where 73 MHz filters or resonators are required, the electrodes 134, 136 and 136' comprise aluminum in a range of about 800 Å to about 1200 Å, for acceptable electrode conductance and low unwanted response content.

In the application for 45 MHz resonators or filters, the aluminum electrodes 134, 136 and 136' usually range in thickness from about 1500 Å to about 2400 Å, for maximizing electrical conductance of the electrode and minimizing spur responses.

The following is a preferred process flow for making a compliantly mounted overtone device.

1) Selective metallization. First, the outer portions 114 and 116 of the piezoelectric element are metalized. The piezoelectric elements are securely mounted in metal masks that expose outer portions of the piezoelectric element. The masks are inserted into a vacuum chamber, which is hermetically closed and evacuated. When the desirable level of vacuum is reached, the deposition metal is melted in a crucible that resides in the vacuum chamber. Metal vapors created in the process settle on the exposed surface of the piezoelectric element. If multiple layers of different metals are used, than they are melted and evaporated in different crucibles, one at a time, while the vacuum in the chamber is maintained at all times.

2) Multiple layers. Because the precious metals do not adhere well to the quartz surface, a sublayer 146 and 152 of chrome is deposited before the precious metal 148 and 154 is used. A top layer of chrome 150 and 156 is also deposited the same way onto the precious metal to improve adhesion to the outer surface of the precious metal. All the metallic layers, the sublayer of chrome, the layer of precious metal and the top layer of chrome are deposited in the same vacuum cycle as described in step 1 above.

3) Aluminum electrode deposition. The piezoelectric elements are transferred to different masks that selectively expose areas of the piezoelectric element where the electrodes are to be deposited. As described in step 1, the masks with piezoelectric elements are placed in a vacuum chamber which is evacuated. The aluminum is melted in a crucible which deposits the metal that makes up the device electrodes.

4) Dispensing of the adhesive. The substrates which are to be used as the bases of these devices are inserted into fixtures that hold the parts in arrays. A needle of the syringe containing the uncured adhesive is placed in close proximity to the substrate. A predetermined amount of adhesive is ejected under pressure from a syringe onto the substrate. Using this process, adhesive is applied to the desired areas of the substrate, as shown in the figures.

5) Placing of the piezoelectric element. The piezoelectric element 106 is placed on the substrate 102 in such a way that the uncured adhesive contacts the piezoelectric element mainly in the outer portions 114 and 116 of the element that halve been previously metallized.

6) Curing. The piezoelectric elements that are mounted on the substrates, are placed in ovens for a predetermined time and temperature. This cures the adhesive which changes the state from a thick liquid to compliant solid material or interface 112 and 112'. The piezoelectric elements become securely fastened to the substrate.

7) Finish plating. The devices are placed in a vacuum chamber where the small amount of metal, typically gold, is deposited individually onto each of the piezoelectric elements. The finish plating metal is deposited mainly onto the area of piezoelectric elements that is occupied by an outer aluminum electrode. At the time of this plating, the device is electrically connected to suitable equipment for monitoring the frequency and other parameters of the device. The deposition of the metal is stopped when the device reaches the desired parameters or frequency.

8) Sealing. The covers are placed on the devices in such a way that they contact only the substrate and not the piezoelectric elements. The devices are placed into a seal chamber from which the air is evacuated. The inert gas, typically nitrogen, is injected into the chamber. The parts are hermetically sealed using the process that depends on the model of the device. In some cases, the parts are heated up to melt the solder material that joins the substrate to the cover. In other cases, electrical current is passed through the cover to weld it to the substrate base.

Although the present invention has been described with reference to certain preferred embodiments, numerous modifications and variations can be made by those skilled in the art without departing from the novel spirit and scope of this invention.

What is claimed is:

1. A method of compliantly mounting a piezoelectric device with a substrate, comprising the steps of:
   (a) selectively metallizing outer portions of a piezoelectric element with a material which is substantially resistant to oxidation;
   (b) selectively depositing at least one layer of a light weight metal on the piezoelectric element, by: (i) forming a predetermined electrode pattern; and (ii) overlapping the outer metallized portions with the light weight metal such that at least part of the oxidation resistant material is exposed;
   (c) selectively dispensing an uncured conductive compliant material on a substrate; and
   (d) placing and aligning the piezoelectric element on the conductive compliant material, such that upon curing the conductive compliant material forms a compliant mount connecting the exposed oxidation resistant material with the substrate.

2. The method of claim 1, wherein the selective metallizing step includes providing a plurality of layers of metals on the outer portions of a piezoelectric element.

3. The method of claim 1, wherein the curing step includes subjecting the compliant conductive adhesive to a predetermined temperature for a predetermined duration to form a compliant coupling.

4. The method of claim 1, further comprising the step of tuning the piezoelectric element by adjusting the mass of the electrode pattern on the piezoelectric element.

5. The method of claim 1, further comprising the step of enclosing the piezoelectric element in an inert environment.

6. The method of claim 1, further comprising forming an overtone device including a filter or a crystal.

7. A method of compliantly mounting a piezoelectric device with a substrate, comprising the steps of:
   (a) selectively metallizing outer portions of a piezoelectric element, by;
      providing a first layer comprising chromium directly on the outer portions of the piezoelectric element;
      providing a second layer comprising a precious metal on the first layer; and
      providing a third layer comprising chromium on the precious metal layer;
   (b) selectively depositing at least one layer of aluminum on the piezoelectric element, by: (i) forming a predetermined electrode pattern; and (ii) contacting the outer metallized portions;
   (c) selectively dispensing an uncured conductive compliant material on a substrate; and
   (d) placing and aligning the piezoelectric element on the conductive compliant material, such that upon curing the conductive compliant material forms a compliant mount connecting the outer metallized portions of the piezoelectric element with the substrate.

8. The method of claim 7, wherein the second layer comprises gold.

9. A method of compliantly mounting an overtone piezoelectric device with a substrate, comprising the steps of:
   (a) selectively metallizing outer portions of a piezoelectric element, by;
      providing a first layer comprising chromium directly on an outer portion of the piezoelectric element;
      providing a second layer comprising a precious metal on the first layer; and
      providing a third layer comprising chromium on the precious metal layer;
   (b) selectively depositing a layer of aluminum by: (i) forming a predetermined electrode pattern; and (ii) forming an overlap portion connected to the metallized outer portions;
   (c) dispensing a conductive compliant adhesive on the substrate;
   (d) placing the piezoelectric element on the conductive compliant material; and
   (e) curing the conductive compliant material such that a compliant connection is formed coupling the outer metallized portions of the piezoelectric element with the substrate.

10. The method of claim 9, wherein the selective metallizing step includes providing a plurality of layers of metals on outer portions of a piezoelectric element.

11. The method of claim 9, further comprising forming an overtone device including a filter or a crystal.

12. The method of claim 9, wherein the selective metallization step of the outer portions of the piezoelectric element includes providing a sufficient surface area to provide an electrical connection with the compliant conductive material.

13. The method of claim 9, wherein the selective metallizing step includes metallizing outer portions of the piezoelectric element with a precious metal.

14. The method of claim 9, wherein the selective metallizing step includes providing a sufficient thickness to provide a low resistance electrical path.

* * * * *